(12) United States Patent
Plathe

(10) Patent No.: US 7,304,618 B2
(45) Date of Patent: Dec. 4, 2007

(54) REMOTE DISPLAY FOR PORTABLE METER

(76) Inventor: Henry J. Plathe, 12 Tarbox St., Dedham, MA (US) 02026

( * ) Notice: Subject to any disclaimer, the term of this patent is extended or adjusted under 35 U.S.C. 154(b) by 479 days.

(21) Appl. No.: 10/368,040

(22) Filed: Feb. 14, 2003

(65) Prior Publication Data
US 2004/0160410 A1 Aug. 19, 2004

(51) Int. Cl.
G09G 5/00 (2006.01)
(52) U.S. Cl. .......... 345/2.3; 345/1.1; 345/2.1; 345/2.2; 324/111; 324/114; 324/149
(58) Field of Classification Search .......... 345/2.1, 345/1.1, 2.2–2.3, 4.1; 324/111, 114, 149, 324/160
See application file for complete search history.

(56) References Cited

U.S. PATENT DOCUMENTS

| 3,938,207 | A | * | 2/1976 | Drescher ............... 441/57 |
| 4,949,274 | A | | 8/1990 | Hollander et al. |
| 5,008,661 | A | | 4/1991 | Raj |
| 5,072,174 | A | | 12/1991 | Weber |
| 5,153,511 | A | * | 10/1992 | Lee ....................... 324/115 |
| 5,420,739 | A | * | 5/1995 | Yokozawa et al. ......... 360/137 |
| 5,503,145 | A | * | 4/1996 | Clough ................. 128/204.22 |
| 5,514,861 | A | * | 5/1996 | Swartz et al. ........... 235/462.44 |
| 5,602,744 | A | | 2/1997 | Meek et al. |
| 5,640,155 | A | | 6/1997 | Springer |
| 6,095,682 | A | | 8/2000 | Hollander et al. |
| 6,098,886 | A | * | 8/2000 | Swift et al. ............. 235/472.01 |
| 6,151,208 | A | * | 11/2000 | Bartlett ...................... 361/683 |
| 6,330,092 | B1 | | 12/2001 | Aronson ..................... 398/152 |
| 6,384,591 | B1 | * | 5/2002 | Estep et al. ................. 324/111 |
| 6,445,175 | B1 | | 9/2002 | Estep et al. |
| 6,525,819 | B1 | * | 2/2003 | Delawter et al. ........... 356/406 |
| 2002/0149384 | A1 | * | 10/2002 | Reasoner ................... 324/761 |
| 2003/0137310 | A1 | * | 7/2003 | Holzel ....................... 324/537 |

FOREIGN PATENT DOCUMENTS

EP 0 318 549 B1 1/1988

* cited by examiner

Primary Examiner—Richard Hjerpe
Assistant Examiner—Leonid Shapiro
(74) Attorney, Agent, or Firm—David J. Rikkers; Foley & Lardner LLP

(57) ABSTRACT

A remote display is provided for use with a portable meter, such as a portable meter used for obtaining electrical measurements. The remote display can optionally be mounted to an extremity of a user for displaying information obtained by the portable meter within an operating area of a user. The user may position leads that are coupled to the portable meter to obtain a measurement of an electrical apparatus, without having to look away, as the remote display may be positioned on the user's hand. Controls may also be located on the remote display, on a lead and/or on the portable meter for control of the display mode of the remote display and/or various operations of the portable meter.

58 Claims, 7 Drawing Sheets

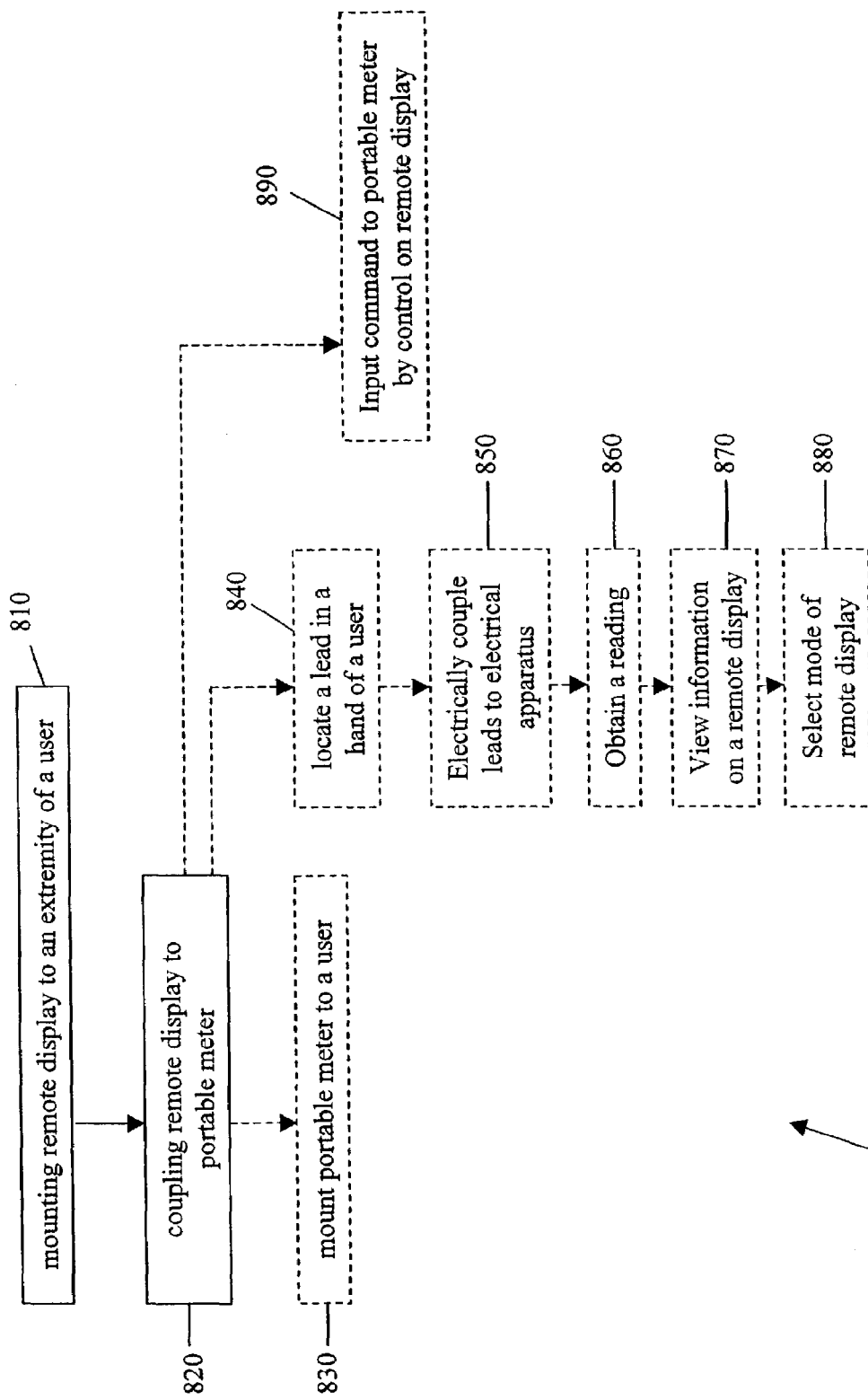

REMOTE DISPLAY FOR PORTABLE METER

TECHNICAL FIELD

This invention relates to portable meters, such as meters capable of obtaining electrical measurements. Specifically, the invention relates to the display of information obtained by portable meters.

BACKGROUND

The use of portable meters is often a cumbersome process. To obtain an electrical measurement with a portable meter, a user typically locates a place to rest the portable meter so that the user can observe the display on the portable meter. The user then maneuvers two leads into position to contact the electrical apparatus to be measured, while simultaneously looking to the portable meter to read the information from the display.

There are many situations in which there is no shelf or suitable resting place for the portable meter. In such a case, a second person may be required to hold the portable meter. Even if the portable meter can be located nearby, safety may be compromised while attempting to obtain an electrical measurement, as the user is often distracted from positioning the leads on the electrical apparatus because the user has to turn away to observe the display on the portable meter. In many cases, very high voltages are located on the electrical apparatus, presenting a substantial risk of electrical shock to the user if the leads slip or move when the user turns away. Also, accuracy of the electrical measurement may be compromised if the leads are not precisely located. A user may initially place each of the leads in specific locations, only to have one or both move slightly when the user turns their head to view the portable meter. In many cases, this will result in an erroneous measurement, because the leads are positioned differently, perhaps measuring different terminals on the electrical apparatus.

Also, substantial time may be required to obtain an electrical measurement with a conventional portable meter. For example, a user may need to take time to locate the portable meter close to the electrical apparatus, such that the wires connecting the leads to the portable meter reach the electrical apparatus. Simultaneously, the portable meter should be within view of the user, oriented so that the meter's display faces the user, while the user is holding the leads in position on the electrical apparatus.

Also, cramped or low-light working conditions can complicate the ability of a user to read the display on the portable meter. The ability of a user to locate a portable meter such that the display is both well lighted and directed toward the user when resting at a location near the electrical apparatus is often limited.

Various approaches in the art have been used to attempt to overcome the above difficulties. Examples include use of different types of leads, such as alligator clips, that are capable of gripping a portion of the electrical apparatus, such that the user does not need to hold the lead in place. Although alligator clip-type leads may help to free a hand of the user so that the user can hold the portable meter, alligator clip-type leads are not usable in many situations, as the electrical apparatus may not have the shape that can be gripped by the alligator clip-type lead. Furthermore, the use of different types of leads can still involve problems, as the attachment and removal of alligator clip-type leads, if usable at all, are typically more time consuming than standard probe-type, leads.

SUMMARY OF THE INVENTION

The present invention addresses the difficulty of the prior art by providing a remote display for use with the portable meter. According to one aspect of the invention, the remote display may be mounted to an extremity, such as a wrist or hand, of a user. In such a case, the user can simultaneously operate two leads while reading the remote display, without having to look away from the area in which the user is holding the leads. Therefore, safety and efficiency can be enhanced, as the user can quickly locate the leads and obtain information from the portable meter by viewing the remote display, without needing to turn away from the general area in which the leads are being held.

According to another aspect of the invention, the portable meter may be mounted to the user, such as by a belt clip. In such a case, the user can quickly locate one or more leads on an electrical apparatus and rapidly view the information obtained by the portable meter on the remote display, without first positioning the portable meter on a nearby surface. Because the portable meter is mounted to the user in this case, the wires connecting the leads to the portable meter can be sized to accommodate the reach of the user.

According to further aspects of the invention, controls may be positioned on the remote display, a lead and/or on the portable meter for control of the display mode of the remote display or various operations of the portable meter.

According to one embodiment of the invention, a remote display for a portable meter capable of obtaining an electrical measurement is provided having a display panel configured to remotely display information obtained from the portable meter. According to this embodiment, a case is provided for accommodating the display panel and a first port is provided to be coupled to the display panel and configured to receive data corresponding to the information from the portable meter.

According to a further embodiment of the invention, a remote viewing apparatus is provided for use with a portable meter that is capable of obtaining an electrical measurement. According to this embodiment, a remote display which is adapted to display the electrical measurement is provided along with a remote display holder. The remote display holder is coupled to the remote display and is adapted to enable the remote display to be mounted to a user.

According to another embodiment of the invention, a system for obtaining electrical measurements is provided. The system includes a remote display and a portable meter capable of obtaining an electrical measurement. The remote display is remotely located from the portable meter and is coupled to the portable meter. The remote display is also capable of displaying information obtained by the portable meter.

According to a further embodiment of the invention, a method is provided for configuring a remote display. The remote display is coupled to a portable meter. The method includes the steps of mounting a remote display to an extremity of a user by the use of a remote display holder and coupling a remote display to the portable meter.

BRIEF DESCRIPTION OF THE DRAWINGS

The invention will be apparent from the description herein and the accompanying drawings, in which like reference characters refer to the same parts throughout the different views.

FIG. 12 is an illustration of a method according to an embodiment of the invention.

DETAILED DESCRIPTION

Figure 1:
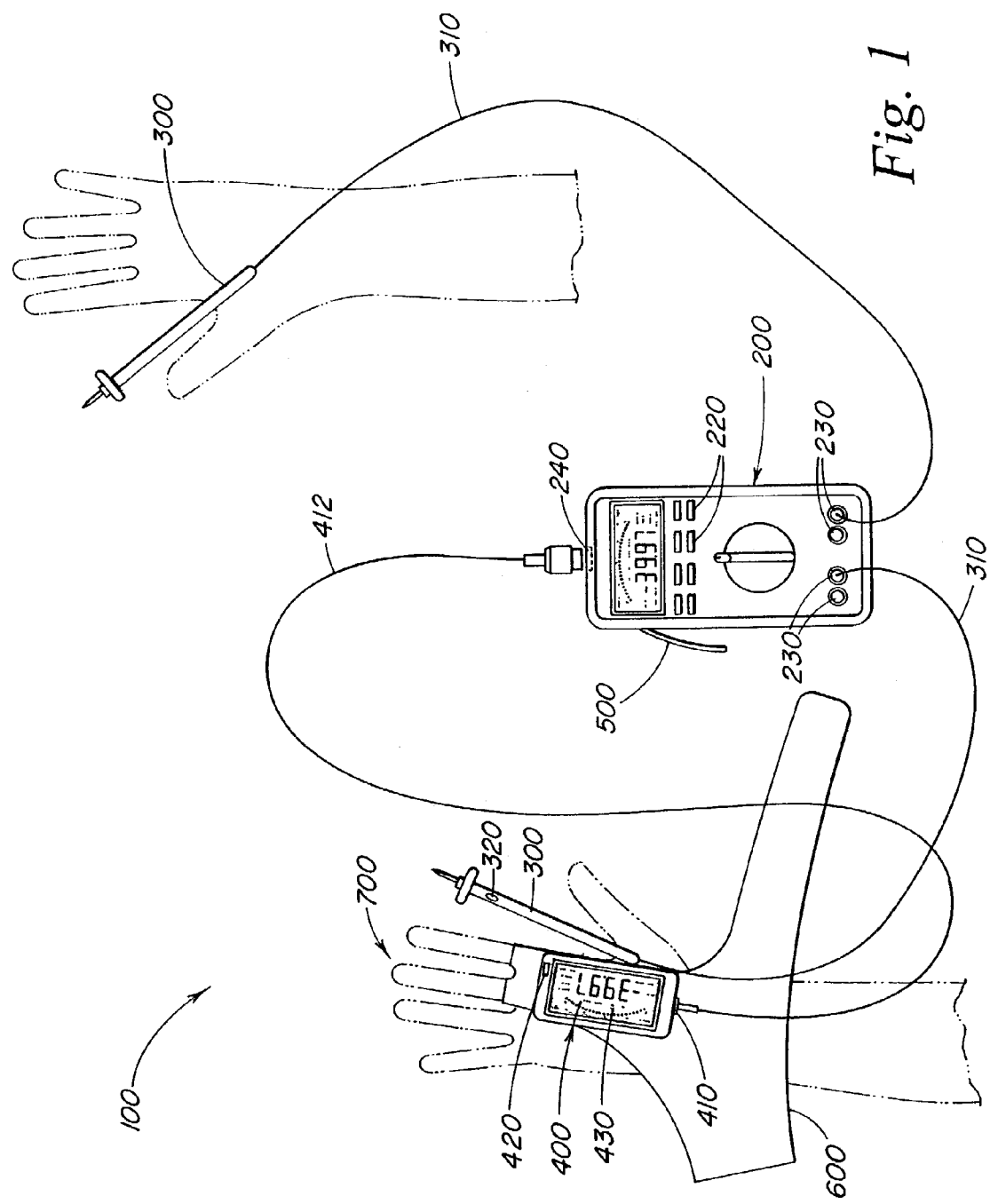
FIG. 1 is a description of a system for obtaining electrical measurements according to an embodiment of the invention.

A system 100 for obtaining electrical measurements is illustrated by way of example in FIG. 1. A remote display 400 is provided for use with a portable meter 200. The portable meter 200 may be similar to any of a wide variety of portable meters, such as a multimeter capable of obtaining electrical measurements.

As used herein, the term "portable meter" is intended to include meters and test devices that are portable. Portable meters and test devices may be configured for handheld use and may optionally be placed on a desktop or test bench. Often, portable meters will be configured to be used with leads, although the invention is not so limited. Examples of portable meters include, but are not limited to, test devices to analyze data transmission on network cabling and/or multimeters. Examples of multimeters on which the portable meter 200 may be based include the FLUKE 189 Digital Multimeter from FLUKE Corporation of Everett, Washington, the True RMS Reading Multimeter, part number 93-105/00408, available from GREENLEE TEXTRON Inc. of Rockford Ill., the TEST BENCH Model 391A available from BK PRECISION of Yorba Linda, Calif. and the Handheld MULTISCOPE, part number 381265 available from EXTECH INSTRUMENTS Corporation of Waltham, Mass.

Figure 2:
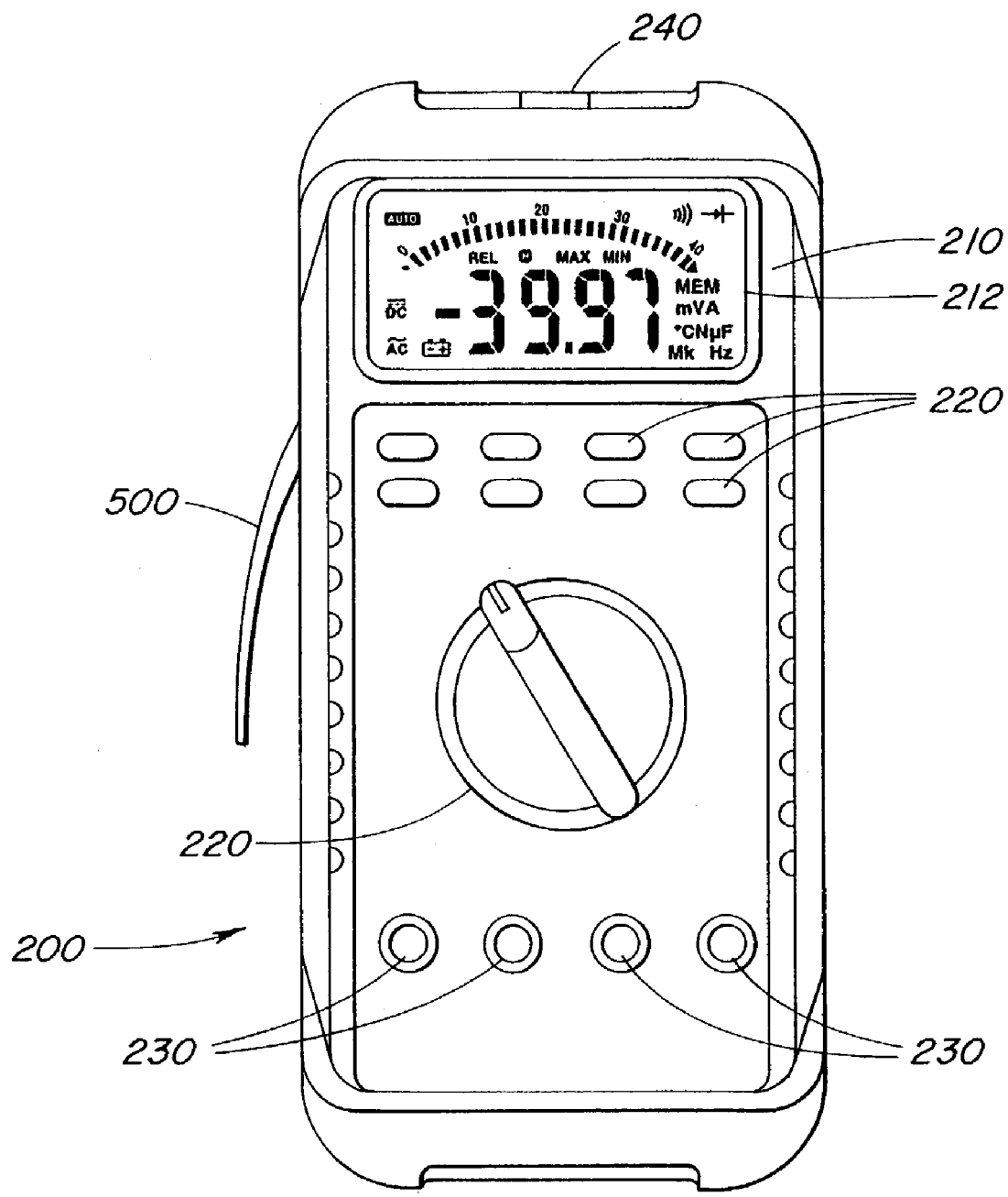
FIG. 2 is an illustration of a portable meter according to an embodiment of the invention.

As also shown in FIG. 2, the portable meter 200 may optionally be provided with a display 210 and controls 220 to provide control inputs to operate the functions of the portable meter 200 and/or a remote display 400. Lead ports 230 may also be provided for attaching leads 300, as is typically done by the use of a lead wire 310 associated with each lead 300. A remote display interface port 240 is also provided for communication with the remote display 400.

The remote display 400 includes a display panel 430 and a communications port 410 for communication coupling with the remote display interface port 240 of the portable meter 200. Optionally, a remote display cable 412 may be used to couple the communications port 410 to the remote display interface port 240. As described in more detail herein, a control 420 may be provided on the remote display 400 to provide a control input for controlling a display mode of the remote display 400 and/or operation of the portable meter 200. Similarly, a control 320 may also be provided on a lead 300 for controlling a display mode of the remote display 400 and/or operation of the portable meter 200.

The system 100 may also include a portable meter holder 500 for mounting the portable meter 100 to a user. A remote display holder 600 may also be provided for mounting the remote display 400 to a user. According to one aspect of the invention, the remote display holder 600 is configured to mount the remote display 400 to an extremity 700 of a user, such as a wrist and/or hand.

With further reference to FIG. 2, the display 210 of the portable meter 200 is shown by way of example. A wide variety of displays are within the scope of the invention. The display 210 may be tailored for specific applications for which the portable meter 200 is intended. Furthermore, the display 210 may be omitted from the portable meter 200 entirely. The remote display 400 may be configured to be attachable to and detachable from the portable meter 200. In such a case, the remote display 400 could optionally be able to be located in the position of the display 210 of FIG. 2 when attached to the portable meter 200. The remote display 400 could be held in place by a hook and loop fastener, a latch, a clip, a snap, or other devices able to mount the remote display 400 to the portable meter 200. When removed from this position, the remote display 400 would provide the capability of remotely displaying information obtained from the portable meter.

The remote display interface port 240 may be configured to provide a wired connection to the remote display 400 by the use of a remote display cable 412, as illustrated in FIG. 1. Alternatively, the remote display interface port 240 may be configured to provide a wireless coupling for communication to the remote display 400. A wireless coupling may be formed in a wide variety of ways. Some examples of wireless couplings include infrared (IR) communications or other invisible or visible light signals as well as radio frequency (RF) signals, or other electromagnetic wavelength communications and other wireless coupling types known in the art for communication between electronic devices.

Providing display signals to the display 210 in the portable meter 200 is conventional. According to the invention, the remote display interface port 240 may be configured to provide the same display signals to the remote display 400 that are provided to the display 210 of the portable meter 200. Alternatively, the portable meter 200 may be configured to enable different information and/or display signals to be provided to the remote display interface port 240 for use by the remote display 400. In the event the display 210 is omitted from the portable meter 200, the display signals that would typically be provided to the display 210 could be provided to the remote display interface port 240 for use by the remote display 400.

The remote display interface port 240 may also be configured to send and/or receive information relating to control inputs that may be activated by controls on the portable meter 200, the remote display 400 and/or a lead 300. The one or more lead ports 230 may also be configured to send and/or receive information relating to control inputs that may be activated by controls on one or more leads 300. It is understood that the controls 220 may be omitted from the portable meter 200, as optional controls on the remote display 400 and/or leads 300 may be used to control the portable meter 200.

The lead 300 may be any of a wide variety of leads known in the art. Examples include probe leads, alligator-clip leads, and leads that can be used to obtain other measurements. Examples include leads for measuring temperature, radio frequency (RF) signals and luminance.

The portable meter holder 500 may be provided to mount the portable meter 200 to a user. Examples of portable meter holders 500 include belt loops, belt clips, shoulder straps, or other devices known in the art for mounting a device to a user. The portable meter holder 500 may include the use of an adhesive or strapping or other fastening devices, such as hook and loop fasteners, such as fasteners available from VELCRO Corporation to secure the portable meter 200. In the case of the remote display 400 being attachable to the portable meter 200, the portable meter holder 500 may optionally use a similar fastening device as is used between the remote display 400 and portable meter 200. For example, a hook and loop fastener may be used in both cases, allowing a user to detach the remote display 400 from the portable meter 200 and attach the remote display 400 to the portable meter holder 500.

Figure 3:
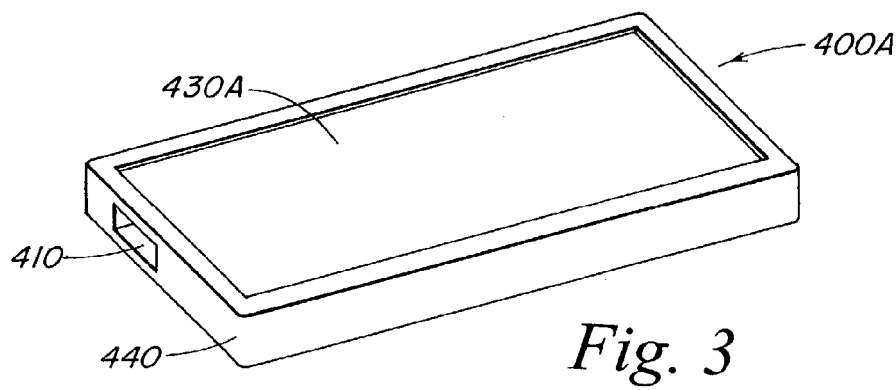
FIGS. 3-6 are illustrations of various examples of remote displays according to embodiments of the inventions.

Various examples of remote displays 400 are shown in FIGS. 3-6. With reference to FIG. 3, a remote display 400A is illustrated having a display panel 430 accommodated within a case 440. A communications port 410 is provided for communication with the portable meter 200. As described above, the portable meter 200 and remote display 400 may communicate via a remote display cable 412 or via wireless coupling. It is understood that the communications port 410 would be configured for the appropriate type of communications with the portable meter 200. As such, the communications port 410 may be entirely internal to the remote display 400, such as for use with a wireless coupling.

The case 440 of the remote display 200 may be a rigid or flexible case, as appropriate for accommodating the display panel 430. The case 440 may encapsulate the display panel 430 or may be configured to extend along only a portion of the display panel 430. The case 440 is intended to provide a structural link between the communications port 410 and the display panel 430.

The display panel 430 may be formed of a wide variety of display types. For example, light emitting diodes or liquid crystal displays may be used, as well other display technologies known in the art, such as plasma displays. Other types of display panels may be apparent to one of skill in the art upon review of this description and are to be considered within the scope of the invention. The display panel 430 may be configured to display information obtained by the portable meter 200. The information may be displayed in a variety of forms, including by way of example, digital, analog and/or graphical. It is understood that a combination of one or more of various types of display formats may be used in simultaneous or sequential combination.

Figure 4:
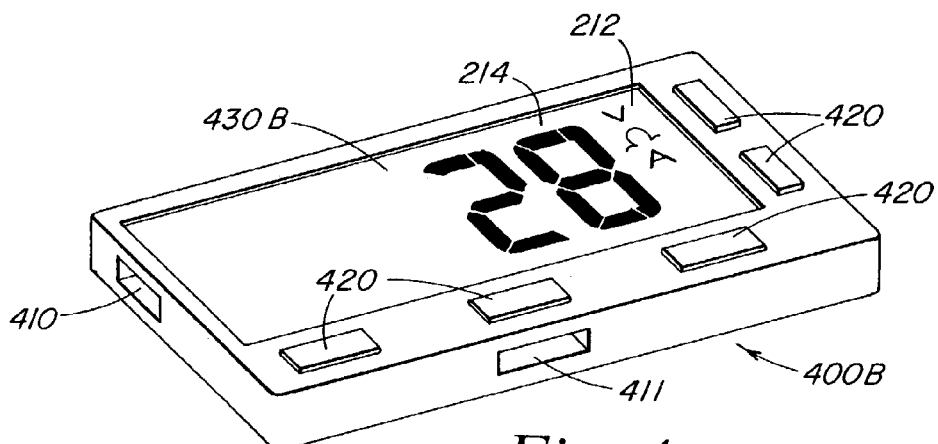

By way of example, FIG. 4 illustrates a remote display 400B having a digital display 214 in combination with unit indicators 212. It is understood that one or more of the unit indicators 212 may be displayed at any time, and that unit indicators for voltage, resistance and current are illustrated simultaneously in FIG. 4 for purposes of illustration.

The remote display 400B of FIG. 4 further illustrates a second communications port 411 that may be used in place of or in addition to the communications port 410. One, two, three or more communications ports may be provided at various locations on or within the remote display 400 for enabling a plurality of mounting options for the remote display 400.

The remote display 400B also illustrates a plurality of controls 420 that may be provided with the remote display 400 for controlling a display mode of the remote display 400 and/or controlling the operation of the portable meter 200 by way of the communication with the portable meter 200. The controls 420 may be any of a wide variety of input devices. Examples include, but are not limited to, a button, a switch, a touch screen, a dial, a knob, a keypad, a joystick and/or a microphone. The microphone may be configured to recognize different sound levels or be equipped with a voice recognition capability. It is understood that the remote display may be provided with any combination of one or more controls 420, or may not be provided with a control 420. Also, the controls 420 are not limited to a front surface of the remote display, and may be provided at any location on the remote display.

Figure 5:
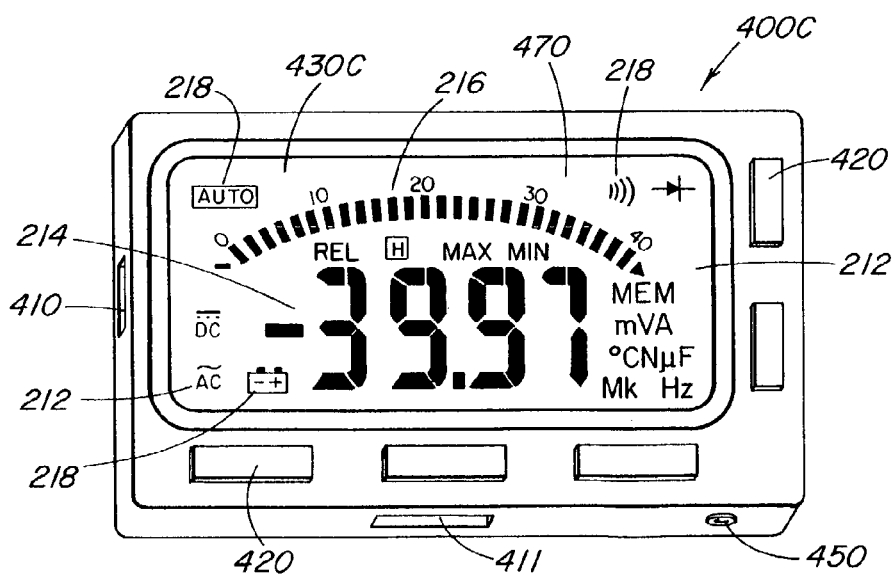

FIG. 5 illustrates a further example of a remote display 400C. The remote display 400C includes various features of the example remote displays 400 of FIGS. 3 and 4, while adding a lead port 450. The lead port 450 enables a user to couple a lead 300 directly to the remote display 400. Such a configuration allows for the coupling between the remote display 400 and portable meter 200 to serve as the communications path for the lead 300 and the portable meter 200. Such an arrangement may reduce the number of wires to be managed by a user and/or may shorten the length of wires, because a short lead wire 310 may be used for the lead 300 held by the user's extremity at which the remote display 400 is mounted. Whereas a longer lead wire 310 would be required if the lead wire 310 extended all the way back to the portable meter 200, which may, be mounted on the user's waist. One or more lead ports 450 may be mounted in any location on the remote display.

The remote display 400C of FIG. 5 also provides a further example of a display panel 430C in the form of a combination display. The display panel 430C shows an example of the simultaneous use of a digital display 214 with an analog display 216 in combination with a variety of unit indicators 212 and other status indicators 218, such as those indicating whether the portable meter 200 is in an auto-ranging mode or whether the portable meter 200 will emit audible signals and a battery status indicator for the portable meter 200. These illustrated examples are not limiting, and the invention can include a wide variety of indicators. The remote display 400C may also be provided with a light 470 to enhance viewing of the display panel 430C and/or controls 420 in low-light conditions. The light 470 may be a wide variety of lights, including direct illumination and back lights and others known in the art for illuminating a display panel.

Figure 6:
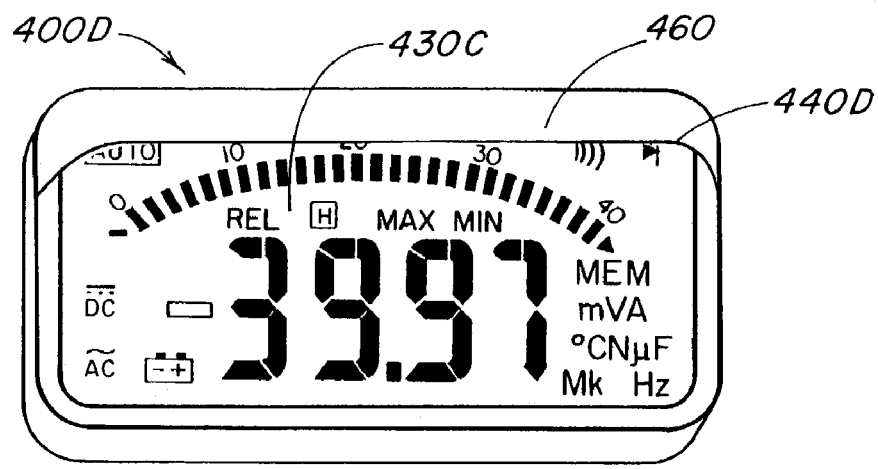

FIG. 6 illustrates a further example of the remote display according to another embodiment of the invention. A remote display 400D is illustrated having the display 430C described above in relation to FIG. 5 and a case 440D that is configured for wireless communication with the portable meter 200. The remote display 400D of FIG. 5 is provided with an optional glare shield 460 that may be fixedly mounted or removably mounted to the case 440D to aid in reducing glare on the display panel 430C.

It is understood that the various features of the remote displays 400 of FIGS. 3-6 may be used in combination and are illustrated by way of example only. The invention is not limited to these examples, and a wide variety of alternatives are within the scope of the invention.

Figure 7:
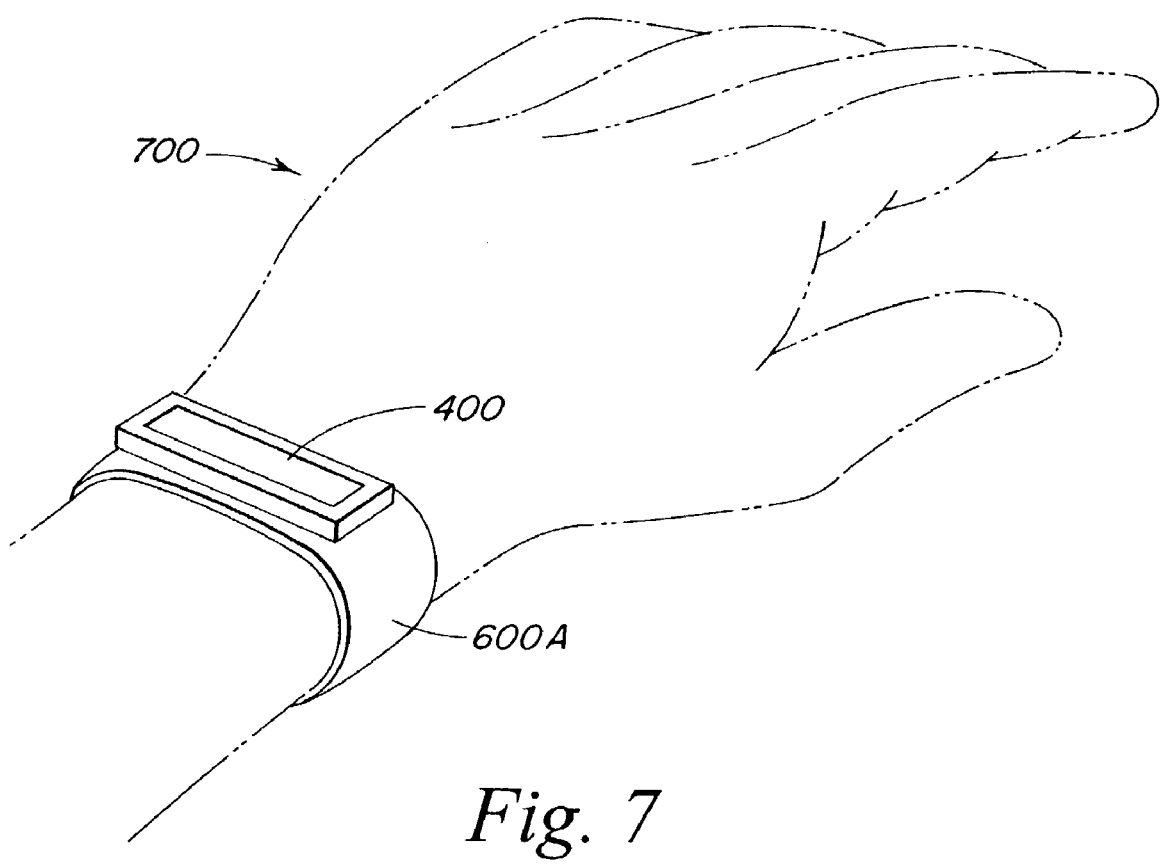
FIG. 7 is an illustration of a remote display holder in the form of a wristband according to an embodiment of the invention.

The remote display 400 may optionally be mounted to a user. Various embodiments of remote display holders 600 are shown in FIGS. 7-11. With reference to FIG. 7, a remote display holder 600A is shown in the form of a wristband to which a remote display 400 is mounted. The wristband is illustrated on an extremity 700 of a user. The remote display 400 may be coupled with the remote display holder 600A by the use of an adhesive, a hook and loop fastener and/or stitching of material. The material may be material forming the remote display holder 600 and/or material encasing or surrounding a portion of the remote display 400 and mated to or forming a part of the remote display holder 600. The remote display holder 600 may be formed of a wide variety of materials including various fabrics, leathers, plastics, rubbers or other items. Examples include materials typically used in the construction of wristbands and gloves known in the art.

Figure 8A:
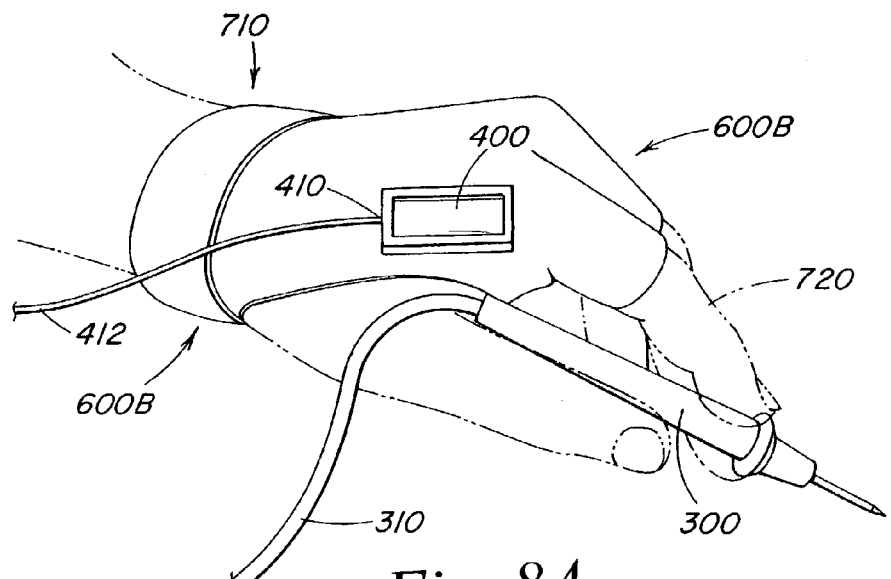
FIGS. 8A, 8B and 9 are illustrations of a remote display holder in the form of a glove according to an embodiment of the invention.
Figure 8B:
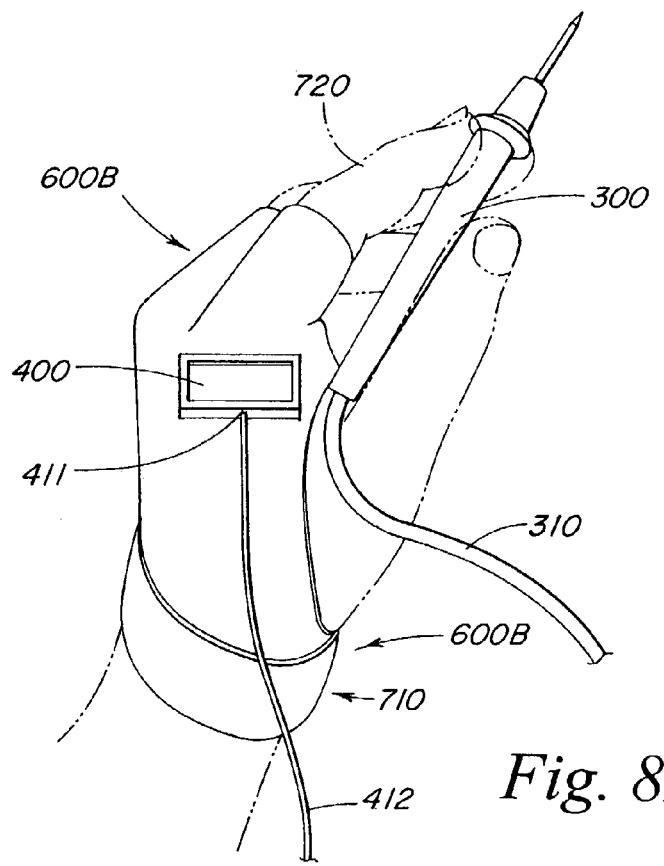
Figure 9:
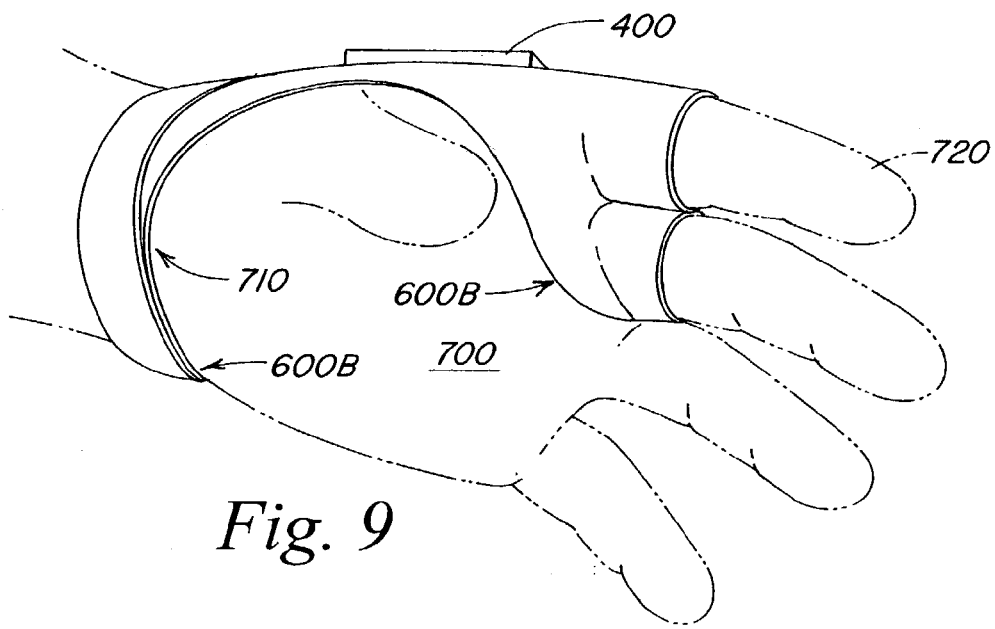

With reference to FIGS. 8A, 8B and 9, a remote display holder 600B is provided in the form of a glove. As illustrated by way of example in FIGS. 8A, 8B and 9, the remote display holder 600B is formed as an open-palm glove arranged to be coupled to a wrist 710 of a user and at least one finger 720 of a user. Coupled to the remote display 600 is a remote display 400. The remote display 400 may be coupled to the remote display holder 600B of FIGS. 8A, 8B and 9 in a wide variety of ways; such as the examples discussed above in relation to the remote display holder 600A of FIG. 7.

The remote display holder 600B in the form of a glove may provide a variety of mounting positions for the remote display 400. In order to enable the remote display 400 to be positioned for correct orientation within the view of a user. For example, the remote display 400 may be configured to include a remote display cable 412 connected to the communications port 410 to locate the remote display 400 proximate to a thumb and a back of the hand of the user. One example of such a location of the remote display 400 is to longitudinally orient the remote display 400 between a user's wrist 710 and forefinger 720, as shown in FIG. 8A. This arrangement may be desirable if the user is working to obtain measurements at or below an eye-level of the user. In another example, as shown in FIG. 8B, the remote display 400 may be configured with the remote display cable 412 coupled to the second communication port 411. In such a case, the remote display 400 may be located transversely between a user's wrist 710 and forefinger 720. Such a configuration may be more suitable to obtaining measurements above an eye-level of the user, as the remote display 400 may then be more easily read by the user. It is understood that a communication port 410 may be located at an opposite end of the remote display 400 in addition to or in place of the illustrated communication ports. By locating a communication port at an opposite end of the remote display 400, the remote display 400 may be easily configured for use on another hand of the user by the use of an appropriate remote display holder 600, such as a glove formed for a right hand. It is understood that a wireless coupling may be used between the remote display 400 and portable meter 200.

The remote display holders 600 illustrated in FIGS. 7-9 may be provided to conveniently locate a remote display 400, while allowing a user to manipulate one or more leads 300. The remote display holder 600B of FIGS. 8A, 8B and 9 is configured to be secured about a user's wrist 710 and at least one finger 720, while not encasing the finger 720, thereby retaining the user's ability to touch the lead and/or other objects without interference from the remote display holder 600B. It is understood that the invention is not so limited and any form of glove may be used in combination with the remote display 400, including gloves fully enclosing a user's hand and/or not coupled to a user's wrist.

Figure 10:
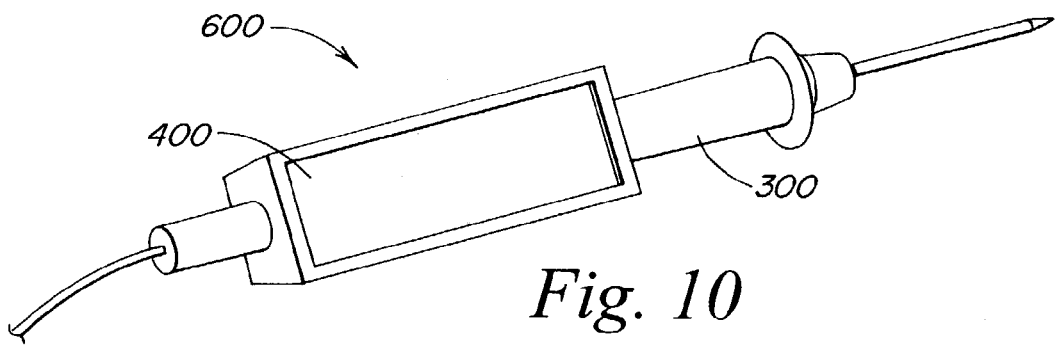
FIG. 10 is an illustration of a lead coupled to a remote display according to an embodiment of the invention.
Figure 11:
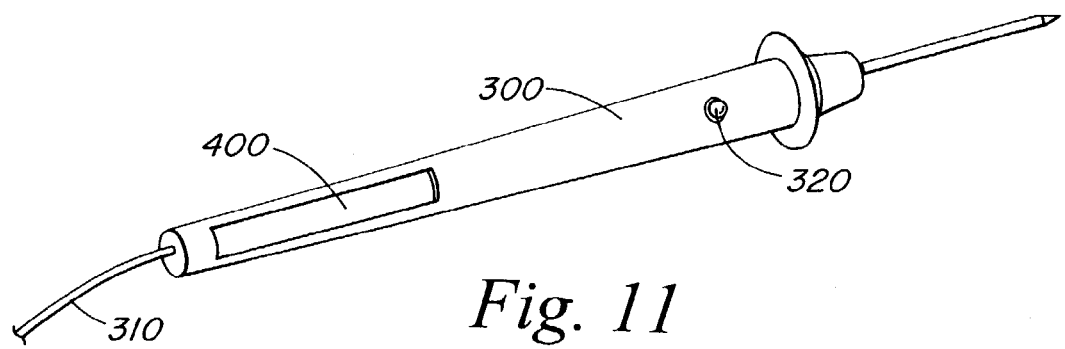
FIG. 11 is an illustration of a lead incorporating a remote display according to an embodiment of the invention.

Examples of leads 300 are provided in FIGS. 10 and 11. FIG. 10 illustrates a lead 300 also operating as a remote display holder 600. Specifically, a remote display 400 is coupled to the lead 300 in any of a variety of ways, such as examples described above in relation to other remote display holders. The coupling may be configured to allow the remote display 400 to be removable from the lead 300. Alternatively, the remote display 400 may be fixedly secured to the lead 300.

It is understood that a wide variety of leads are within the scope of the invention. Any leads known in the art for use with portable meters are within the scope of the invention. Leads 300 may or may not operate as a remote display holder 600.

As illustrated in FIG. 11, a remote display 400 may be incorporated within the lead 300. In such a configuration, the lead 300 may optionally serve as a case for the display panel of the remote display 400. The embodiment of FIG. 11 further illustrates a control 320 provided on the lead 300. As discussed above in relation to the controls 420 of the remote display 400, the control 320 may be used to control a display mode of the remote display 400 and/or various functions of the portable meter 200. In the embodiment of FIG. 11, a remote display cable may be configured within the lead wire 310 and/or a wireless coupling to the portable meter 200 may be used. It is understood that a plurality of controls 320 may be provided on the lead 300.

As shown in FIG. 12, a further embodiment of the invention is provided in the form of a method 800 for configuring a remote display coupled to a portable meter. The method includes a step 810 of mounting a remote display to an extremity of a user by the use of a remote display holder. The remote display is coupled, step 829, to a portable meter. Optionally, the method 800 may include the step 830 of mounting the portable meter to a user by the use of a meter holder. The method 800 may also optionally include the step of locating, step 840, a lead in the hand of a user. Also, a first and second lead may be electrically coupled, step 850, to an electrical apparatus. A reading may be obtained, step 860, on the portable meter. The reading is representative of a characteristic of the electrical apparatus that is sampled by the first and second leads. Information may then be viewed, step 870, on the remote display that corresponds to the reading obtained on the meter, step 860. The viewing step, step 870, may involve the reading being representative of an electrical measurement and the information viewed on the remote display corresponding to voltage, resistance and/or current.

The method 800 may also include the optional step of selecting, step 880, a mode of the remote display by activating a control. The control may be located on a lead, the remote display and/or the portable meter.

The method 800 may also optionally include the step of inputting, step 890, a command to the portable meter by activating a control on the remote display.

The method 800 may include a wide variety of variations, such as the examples described herein in relation to other embodiments of the invention. For example, the mounting of a remote display to an extremity of a user may involve inserting a hand of a user into an open palm glove extending to at least one finger of the hand. By way of further example, the step of mounting the remote display to the extremity of the user may include coupling the remote display holder to at least a wrist of the user. The remote display may also be located proximate to a thumb and a back of a hand of a user. A further example of a variation of the method 800 includes coupling the remote display to the portable meter by the use of at least one wire and/or by the use of a wireless coupling. Optionally, the coupling of the remote display to the portable meter may include selecting from a plurality of ports on the remote display to couple the at least one wire to the remote display.

A wide variety of display modes and functions may be activated by a control. By way of example, various display ranges and an auto-range function may be activated. The portable meter 200 may be instructed to emit audible signals, such as upon the completion of obtaining an electrical measurement. Other portable meter functions include selecting the type of electrical measurement to be made, such as for example voltage, resistance or current measurements. Examples of input commands that may be received by the control include powering on or off the portable meter 200 and/or the remote display 400. Furthermore, illumination for the display panel 430 of the remote display 400 may be activated or deactivated.

The present invention has been described by way of example, and modifications and variations of the described embodiments will suggest themselves to skilled artisans in this field without departing from the spirit of the invention. Aspects and characteristics of the above-described embodiments may be used in combination. For example, the system 100 for obtaining electrical measurements may include any of the additional features described herein in relation to the various components of the system 100 such as the various remote display holders and remote displays and variations thereof. The described embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A remote display for a portable meter capable of obtaining an electrical measurement, comprising:
    a display panel configured to remotely display information obtained from said portable meter;
    a case accommodating said display panel;
    a first port coupled to said display panel and configured to receive data corresponding to said information from said portable meter;
    a control for said portable meter coupled to said first port to enable a control input for said portable meter to select a mode of said remote display; and
    a second port located apart from said first port configured to receive data from said portable meter.

2. The remoto display of claim 1, wherein said display panel is a liquid crystal display having at least one unit indicator specific to an electrical measurement unit and incorporated into the liquid crystal display.

3. The remote display of claim 2, wherein said unit indicator is specific to an electrical in measurement unit selected from the group of volts and ohms.

4. The remote display of claim 1, wherein said electrical measurement is at least one of the group of voltage, resistance and current.

5. The remote display of claim 1, wherein said first port is configured to receive at least one wire.

6. The remote display of claim 1 wherein said first port is configured to communicate with said portable meter without the use of wires coupling said first port to said portable meter.

7. The remote display of claim 1, further comprising a lead port coupled to said case and in communication with said first port to enable a lead for use with said portable meter to be coupled to said portable meter through said remote display.

8. The remote display of claim 1, further comprising a light positioned to illuminate said display panel.

9. The remote display of claim 1, further comprising a glare shield mounted to said case and positioned to inhibit light from striking said display panel.

10. The remote display of claim 1, wherein said case is integral with a lead for use with said portable meter.

11. The remote display of claim 1, wherein said display panel displays said information digitally.

12. A remote viewing apparatus for use with a portable meter capable of obtaining an electrical measurement, comprising:
    a remote display to display said electrical measurement obtained by said portable meter; and
    a remote display holder coupled to said remote display and to mount said remote display to an arm or hand of a user;
    wherein said remote display holder is formed as a glove and said remote display is mounted to said glove by least by a hook and loop fastener.

13. The remote viewing apparatus of claim 12, wherein said remote display comprises:
    a display panel configured to remotely display information obtained from said portable meter;
    a case accommodating said display panel; and
    a first port coupled to said display panel and configured to receive data corresponding to said information from said portable meter.

14. The remote viewing apparatus of claim 13, wherein said display panel is a liquid crystal display having at least one unit indicator specific to an electrical measurement unit and incorporated into the liquid crystal display.

15. The remote viewing apparatus of claim 14, wherein said unit indicator is specific to an electrical measurement unit selected from the group of volts and ohms.

16. The remote viewing apparatus of claim 13, further comprising a second port located apart from said first port configured to receive data from said portable meter.

17. The remote viewing apparatus of claim 13, further comprising a control for said portable meter, mounted to said remote display and coupled to said port to enable a control input for said portable meter to be entered by a user at said remote display and provided through said first port.

18. The remote viewing apparatus of claim 12, wherein said remote display holder is to mount to an extremity of said user.

19. The remote viewing apparatus of claim 12, wherein said remote display holder to mount to at least a wrist of a user.

20. The remote viewing apparatus of claim 12, wherein said remote display holder to mount to a hand of a user to lo ate said remote display proximate to a thumb and back of said hand of said user.

21. The remote viewing apparatus of claim 12, wherein said glove is formed as an open-palm glove.

22. The remote viewing apparatus of claim 21, wherein said glove does not encase any fingers.

23. The remote viewing apparatus of claim 12, wherein said remote display is mounted to said glove by at least by stitching.

24. A system for obtaining electrical measurements, comprising:
    a portable meter capable of obtaining an electrical measurement;
    a remote display, remotely located from said portable meter, coupled to said portable meter and capable of displaying information obtained by said portable meter; and
    a remote display holder in the form of a glove, coupled to said remote display and adapted to mount to an extremity of a user.

25. The system of claim 24, wherein said remote display holder is adapted to mount to at least a wrist of a user.

26. The system of claim 24, wherein said remote display holder is adapted to mount to a hand of a user to locate said remote display proximate to a thumb and a back of said hand of said user.

27. The system of claim 24, wherein said remote display holder further comprises a hook and loop fastener coupling said remote display to said glove.

28. The system of claim 24, further comprising a meter holder coupled to said portable meter and adapted to enable said portable meter to be mounted to a user.

29. The system of claim 24, further comprising at least one lead for use with said portable meter.

30. The system of claim 29, further comprising a control on said lead to send a control input to said portable meter.

31. The system of claim 29, wherein said remote display is integral with said lead.

32. The system of claim 29, further comprising control on said lead for selecting a mode of said remote display.

33. The system of claim 29, further comprising a lead port coupled to said remote display and in communication with said portable meter to enable a lead for use with said portable meter to be coupled to said portable meter through said remote display.

34. The system of claim 33 further comprising a control on said portable meter for selecting a mode of said remote display.

35. The system of claim 24, further comprising control on said remote display for selecting a mod of said remote display.

36. The system of claim 24, wherein said remote display comprises:
  a display panel configured to remotely display information obtained from said portable meter;
  a case accommodating said display panel; and
  a first port coupled to said display panel and configured to receive data corresponding to said information from said portable meter.

37. The system of claim 36, wherein said display panel displays said information digitally.

38. The system of claim 24, further comprising a control for said portable meter coupled to said port to enable a control input for said meter to be entered by a user at said remote display and provided through said port.

39. The system of claim 24, wherein said coupling of said remote display to said portable meter is performed by at least one wire.

40. The system of claim 24, wherein said coupling of said remote display to said portable meter is performed by a wireless coupling.

41. The system of claim 24, wherein said remote display is attachable and detachable from said portable meter.

42. A method of configuring a remote display coupled to a portable meter, said method comprising the steps of:
  mounting a remote display to an extremity of a user by he us of a remote display holder; and
  coupling said remote display to said portable meter;
  wherein said step of mounting a remote display to an extremity of a user includes locating said remote display proximate to a thumb and a back of a hand of said user.

43. The method of claim 42, further comprising the step of mounting said portable meter to a user by the use of meter holder.

44. The method of claim 42, further comprising the step of locating a first lead in a hand of said user.

45. The method of claim 44, further comprising the steps of:
  electrically coupling said first lead and a second lead to an electrical apparatus;
  obtaining a reading on said portable meter representative of a characteristic of said electrical apparatus sampled by said first lead and said second lead; and
  viewing information corresponding to said reading on said remote display.

46. The remote display of claim 45, wherein said step of viewing involves said reading being representative of an electrical measurement and said information is a value corresponding to at least one of the group of voltage, resistance and current.

47. The method of claim 45, further comprising the step of selecting a mode of said remote display by activating control on said at least one lead.

48. The method of claim 45, further comprising the step of selecting a mode of said remote display by activating a control on said remote display.

49. The method of claim 45, further comprising the step of selecting a mode of said remote display by activating a control on said portable meter.

50. The method of claim 42, further comprising the step of inputting a command to said portable meter by activating a control on said remote display.

51. The method of claim 42, wherein said step of mounting a remote display to an extremity of a user includes inserting a hand of said user into an open-palm glove extending to at least one finger of said hand.

52. The method of claim 42, wherein said step of mounting a remote display to an extremity of a user includes coupling said remote display holder to at least a wrist of said user.

53. The method of claim 42, wherein said coupling step includes coupling said remote display to said portable meter by the use of at least one wire.

54. The method o claim 53, wherein said coupling step includes selecting from a plurality of ports on said remote display to couple said at least one wire to said remote display.

55. The method of claim 42, wherein said coupling step includes coupling said remote display to said portable meter by the use of a wireless coupling.

56. The method of claim 42, further comprising, before said mounting step, the step of detaching said remote display from said portable meter.

57. A remote viewing apparatus for use with a portable meter capable of obtaining an electrical measurement comprising:
  a remote display to display said electrical measurement obtained by said portable meter; and
  a remote display holder coupled to said remote display and to mount said remote display to an arm or hand of a user;
  wherein said remote display holder to mount to at least a wrist of a user.

58. A method of configuring a remote display coupled to a portable meter, said method comprising the steps of:
  mounting a remote display to an extremity of a user by the use of a remote display holder; and
  coupling said remote display to said portable meter;
  wherein said coupling step includes coupling said remote display to said portable meter by the use of a wireless coupling.

* * * * *

UNITED STATES PATENT AND TRADEMARK OFFICE
CERTIFICATE OF CORRECTION

PATENT NO. : 7,304,618 B2
APPLICATION NO. : 10/368040
DATED : December 4, 2007
INVENTOR(S) : Henry J. Plathe It is certified that error appears in the above-identified patent and that said Letters Patent is hereby corrected as shown below:

At Column 9, Line 38, Claim 2 currently reads as follows:
"The remoto display of claim 1, wherein said display"

At Column 9, Line 38, please correct Claim 2 to read as follows:
-- The remote display of claim 1, wherein said display --

At Column 9, Line 43, Claim 3 currently reads as follows:
"indicator is specific to an electrical in measurement unit"

At Column 9, Line 43, please correct Claim 3 to read as follows:
-- indicator is specific to an electrical measurement unit --

At Column 10, Line 10, Claim 12 currently reads as follows:
"and said remote display is mounted to said glove by"

At Column 10, Line 10, please correct Claim 12 to read as follows:
-- and said remote display is mounted to said glove by at --

At Column 10, Line 45, Claim 20 currently reads as follows:
"lo ate said remote display proximate to a thumb and back of"

At Column 10, Line 45, please correct Claim 20 to read as follows:
-- locate said remote display proximate to a thumb and a back of --

At Column 11, Line 17, Claim 32 currently reads as follows:
"The system of claim 29, further comprising control on"

At Column 11, Line 17, please correct Claim 32 to read as follows:
-- The system of claim 29, further comprising a control on --

At Column 11, Lines 27-28, Claim 35 currently reads as follows:
"The system of claim 24, further comprising control on said remote display for selecting a mod of said remote"

At Column 11, Lines 27-28, please correct Claim 35 to read as follows:
-- The system of claim 24, further comprising a control on said remote display for selecting a mode of said remote --

UNITED STATES PATENT AND TRADEMARK OFFICE
CERTIFICATE OF CORRECTION

PATENT NO. : 7,304,618 B2
APPLICATION NO. : 10/368040
DATED : December 4, 2007
INVENTOR(S) : Henry J. Plathe It is certified that error appears in the above-identified patent and that said Letters Patent is hereby corrected as shown below:

At Column 11, Lines 55-56, Claim 42 currently reads as follows:
"mounting a remote display to an extremity of a user by he us of a remote display holder; and"

At Column 11, Lines 55-56, please correct Claim 42 to read as follows:
-- mounting a remote display to an extremity of a user by the use of a remote display holder; and --

At Column 11, Line 64, Claim 43 currently reads as follows:
"of mounting said portable meter to a user by the user of meter"

At Column 11, Line 64, please correct Claim 43 to read as follows:
-- of mounting said portable meter to a user by the use of a meter --

At Column 12, Line 16, Claim 47 currently reads as follows:
"of selecting a mode of said remote display by activating"

At Column 12, Line 16, please correct Claim 47 to read as follows:
-- of selecting a mode of said remote display by activating a --

At Column 12, Line 38, Claim 54 currently reads as follows:
"The method o claim 53, wherein said coupling step"

At Column 12, Line 38, please correct Claim 54 to read as follows:
-- The method of claim 53, wherein said coupling step --

At Column 12, Line 49, Claim 57 currently reads as follows:
"meter capable of obtaining an electrical measurement com-"

UNITED STATES PATENT AND TRADEMARK OFFICE
CERTIFICATE OF CORRECTION

PATENT NO. : 7,304,618 B2
APPLICATION NO. : 10/368040
DATED : December 4, 2007
INVENTOR(S) : Henry J. Plathe It is certified that error appears in the above-identified patent and that said Letters Patent is hereby corrected as shown below:

At Column 12, Line 49, please correct Claim 57 to read as follows:
-- meter capable of obtaining an electrical measurement, com- --

Signed and Sealed this

Sixth Day of May, 2008

JON W. DUDAS
*Director of the United States Patent and Trademark Office*